US010159136B2

(12) United States Patent
Akhavan-Tafti

(10) Patent No.: US 10,159,136 B2
(45) Date of Patent: *Dec. 18, 2018

(54) SYSTEM AND METHOD FOR PRODUCING LIGHT IN A LIQUID MEDIA

(71) Applicant: AhuraTech LLC, Brighton, MI (US)

(72) Inventor: Hashem Akhavan-Tafti, Howell, MI (US)

(73) Assignee: AhuraTech LLC, Brighton, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/005,085

(22) Filed: Jun. 11, 2018

(65) Prior Publication Data

US 2018/0295698 A1 Oct. 11, 2018

Related U.S. Application Data

(63) Continuation-in-part of application No. 15/681,996, filed on Aug. 21, 2017, now Pat. No. 10,021,761, which is a continuation-in-part of application No. 15/331,027, filed on Oct. 21, 2016, now Pat. No. 9,756,701.

(51) Int. Cl.
| | | |
|---|---|---|
| *H05B 33/14* | (2006.01) | |
| *H05B 33/26* | (2006.01) | |
| *H05B 33/20* | (2006.01) | |
| *H01L 51/52* | (2006.01) | |
| *C09K 11/58* | (2006.01) | |
| *C09K 11/02* | (2006.01) | |

(52) U.S. Cl.
CPC .............. *H05B 33/26* (2013.01); *C09K 11/02* (2013.01); *C09K 11/584* (2013.01); *H01L 51/5203* (2013.01); *H05B 33/14* (2013.01); *H05B 33/20* (2013.01)

(58) Field of Classification Search
CPC ................................ H05B 33/14; H05B 33/26
See application file for complete search history.

(56) References Cited

U.S. PATENT DOCUMENTS

| | | |
|---|---|---|
| 2,901,651 A | 8/1959 | Destriau |
| 5,220,243 A | 6/1993 | Klinedinst et al. |
| 5,308,754 A | 5/1994 | Kankare et al. |
| (Continued) | | |

FOREIGN PATENT DOCUMENTS

| | | |
|---|---|---|
| EP | 1204858 B1 | 5/2008 |
| EP | 1495315 B1 | 8/2013 |
| (Continued) | | |

OTHER PUBLICATIONS

G. Destriau et al "Electroluminescence and Related Topics", IRE, Aug. 5, 1955.

(Continued)

*Primary Examiner* — Douglas W Owens
*Assistant Examiner* — Pedro C Fernandez
(74) *Attorney, Agent, or Firm* — Harness, Dickey & Pierce, P.L.C.

(57) ABSTRACT

A method is presented for producing light using a liquid media. The method includes: hosting nanoparticles in a liquid media; disposing a pair of electrodes in direct contact with the liquid media; and generating an excitation signal between the electrodes in the pair of electrodes, thereby illuminating a portion of the nanoparticles.

11 Claims, 16 Drawing Sheets

(56) References Cited

U.S. PATENT DOCUMENTS

| | | |
|---|---|---|
| 5,893,999 A | 4/1999 | Tamatani et al. |
| 6,054,809 A | 4/2000 | Haynes et al. |
| 6,136,268 A | 10/2000 | Ala-Kleme et al. |
| 6,251,690 B1 | 6/2001 | Kulmala et al. |
| 6,288,221 B1 | 9/2001 | Grinstaff et al. |
| 6,645,776 B2 | 11/2003 | Kulmala et al. |
| 6,821,730 B2 | 11/2004 | Hannah |
| 7,005,108 B2 | 2/2006 | Ala-Kleme et al. |
| 7,513,983 B2 | 4/2009 | Ala-Kleme et al. |
| 7,700,366 B2 | 4/2010 | Swager et al. |
| 7,897,786 B2 | 3/2011 | Ulrich et al. |
| 8,304,259 B2 | 11/2012 | Isobe |
| 8,394,259 B2 | 3/2013 | Palmas et al. |
| 9,756,701 B1 | 9/2017 | Akhavan-Tafti et al. |
| 2002/0084454 A1 | 7/2002 | Kim et al. |
| 2002/0177695 A1 | 11/2002 | Grinstaff et al. |
| 2005/0019955 A1 | 1/2005 | Dahl et al. |
| 2005/0276993 A1 | 12/2005 | Sohn et al. |
| 2007/0170418 A1 | 7/2007 | Bowers et al. |
| 2007/0194694 A1 | 8/2007 | Reddy |
| 2008/0102534 A1 | 5/2008 | Ulrich et al. |
| 2009/0167145 A1 | 7/2009 | Withnall et al. |
| 2009/0278141 A1* | 11/2009 | Coe-Sullivan ......... B82Y 20/00 257/89 |
| 2011/0108738 A1 | 5/2011 | Doty et al. |
| 2012/0119639 A1 | 5/2012 | Staats et al. |
| 2013/0038202 A1 | 2/2013 | Donners |
| 2014/0234999 A1* | 8/2014 | Kim ....................... C09K 11/02 438/26 |
| 2015/0251152 A1 | 9/2015 | Buchholz et al. |
| 2016/0230088 A1* | 8/2016 | Puetz .................... C09K 11/02 |
| 2016/0336526 A1* | 11/2016 | Hirosawa ............... B82Y 20/00 |
| 2018/0202903 A1 | 7/2018 | Chou et al. |

FOREIGN PATENT DOCUMENTS

| | | |
|---|---|---|
| JP | 2010237020 A | 10/2010 |
| KR | 101560846 B1 | 10/2015 |
| WO | 2005073338 A2 | 8/2005 |
| WO | 2007013601 A1 | 2/2007 |
| WO | 2010058328 A2 | 5/2010 |

OTHER PUBLICATIONS

Mingyuan Gao et al "Photoluminescence and Electroluminescence of CdSe and CdTe Nanoparticles", 9th Climtec-World Forum on New Materials, Symposium X, (1999).

Vivek Makeshwari et al "Mineralization of Monodispersed CdS Nanoparticles on Polyelectrolyte Superstructure Forming an Electroluminescent Necklace-of-Beads", Langmuir 22, pp. 8623-8626 (2006).

S. Yamamoto "Evaluation of Distributed Inorganic Electroluminescence (EL) Devices With Comb Electrodes" Trans Mat. Res. Soc. Japan (2013).

L. N. Tripathi et al "Dielectric Dependence of EL Brightness of Powdered Phosphor and Particle Size Distribution" Phy. Stat. Sol. (a) 64, 297 (1981).

J. Kim "High Electroluminescence of the ZnS:Mn nanoparticle/cyanoethyl-resin polymer/single-walled carbon nanoube composite using the tandem structure" Journal of Materials Chemistry, vol. 22, (2012).

W. Lehmann "Contact Electroluminescence", Journal of the Electrochemical Society, vol. 104, No. 1 (1957).

International Search Report and Written Opinion dated Dec. 9, 2016, regarding PCT/US2016/049633.

International Search Report and Written Opinion dated Dec. 11, 2017 regarding PCT/US2017/049606.

\* cited by examiner

SYSTEM AND METHOD FOR PRODUCING LIGHT IN A LIQUID MEDIA

CROSS-REFERENCE TO RELATED APPLICATIONS

This application is a continuation-in-part application of U.S. patent application Ser. No. 15/681,996 filed on Aug. 21, 2017, which is a continuation-in-part application of U.S. patent application Ser. No. 15/331,027 filed on Oct. 21, 2016, now Issued U.S. Pat. No. 9,756,701. The entire disclosure of the above application is incorporated herein by reference.

FIELD

The present disclosure relates to devices and methods for exciting electroluminescent material in polar liquid media.

BACKGROUND

Electroluminescence (EL) is the emission of light from a material in response to an electric stimulus. In a typical construct, a light emitting device is formed by sandwiching an electroluminescent material between two electrode plates. The electroluminescent material and the corresponding light emitting device is operated in dry or non-polar liquid media conditions, not in polar liquid media. The use of luminescent materials in polar liquid media has been limited only to photoluminescence, where the luminescent particles absorb higher energy light from an external light source, and re-emit the absorbed energy as longer wavelength and lower energy light. A major drawback with such applications is that the high-intensity excitation light source can produce a substantial background which overwhelms the secondary light emitted by the luminescent material. Optical filters may be used to block the excitation light from entering a light detector, however they do not fully eliminate the background. The use of optical filters is especially problematic in cases where the re-emitted light from the luminescent materials is already very weak, or there is significant overlap between the excitation and emission wavelengths.

Therefore, it is desirable to achieve improved methods for exciting electroluminescent material in polar liquid media. This section provides background information related to the present disclosure which is not necessarily prior art.

SUMMARY

This section provides a general summary of the disclosure, and is not a comprehensive disclosure of its full scope or all of its features.

A light source is presented that produced light in a liquid media. The light source includes: a support member; a liquid media supported by the support member, at least one pair of electrodes disposed proximate to the support member; and an excitation source electrically coupled to the pair of electrodes. The electrodes are arranged coplanar with each other and a surface of each electrode in the pair of electrodes is in direct contact with nanoparticles, where the nanoparticles are comprised of a luminescent material and are overlaid by the liquid media. The excitation source operates to apply an excitation signal between the electrodes in the pair of electrodes.

In one embodiment, the nanoparticles in the liquid media are deposited onto the surface of the electrodes, for example by removing the liquid media.

In some embodiments, the electrodes are coated with or otherwise separated from the liquid media by a dielectric material.

Nanoparticles may take many different forms. For example, the nanoparticle may be comprised of one or more of a metal chalcogenide, a group IIB-VI semiconductor compound or a group III-V semiconductor compound. The nanoparticles may be doped, for example with dopants chosen from transition metals or rare earth metals. In some example, the nanoparticles may be embedded into a solid phase matrix, where the solid phase matrix is selected from a group comprised of silica gel, cross-linked dextran gel, zeolites and molecular sieves. It is understood that the nanoparticles may include two or more different types of luminescent materials.

In some embodiments, the liquid media is polar and may be selected from a group consisting of water, dimethyl sulfoxide, and dimethylformamide. The liquid media may also include electrolytes or other enhancing elements.

In other embodiments, the liquid media is non-polar and may be selected from a group consisting of mineral oil, castor oil and linseed oil.

In one embodiment, the support member is a plate and the liquid media is disposed on a surface of the plate.

In another embodiment, the support member is a container configured to hold the liquid media and the pair of electrodes are integrated onto an inner surface of the container.

Electrodes may also take different forms. In some embodiments, the pair of electrodes are coplanar. In the same or different embodiments, the electrodes can be interdigitated. The electrodes are preferably comprised of aluminum or aluminum alloys.

In operation, the excitation source generates an electric current between the electrodes in the pair of electrodes. In one embodiment, the excitation source applies a voltage between the electrodes in the pair of electrodes, where polarity of the voltage periodically changes from positive to negative and vice versa. In some embodiments, the pulses of voltage applied between the electrodes are separated by a period of time in which the magnitude of the voltage is a baseline value that is less than peak value of the pulses.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
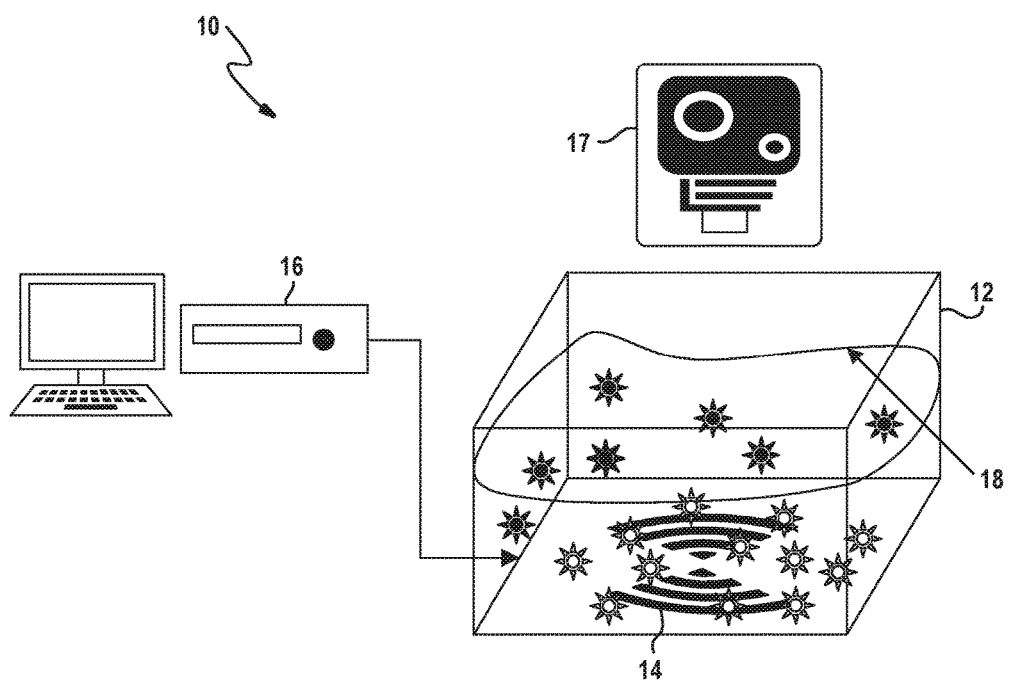
FIG. 1 is a diagram depicting an example embodiment of a light emitting system.

FIG. 1 depicts an example embodiment of a light emitting system 10 for generating light from luminescent matter. The light source (i.e., system) 10 is comprised of a container 12, one or more pairs of electrodes 14 and an excitation source 16. The container 12 is configured to hold a liquid media 18. One or more walls of the container 12 are preferably transparent to allow for light emission. Various shapes and implementations for the container 12 are envisioned by this disclosure. A CCD camera or another type of photodetector 17 may be used to record or otherwise verify the generated emissions.

Figure 11:
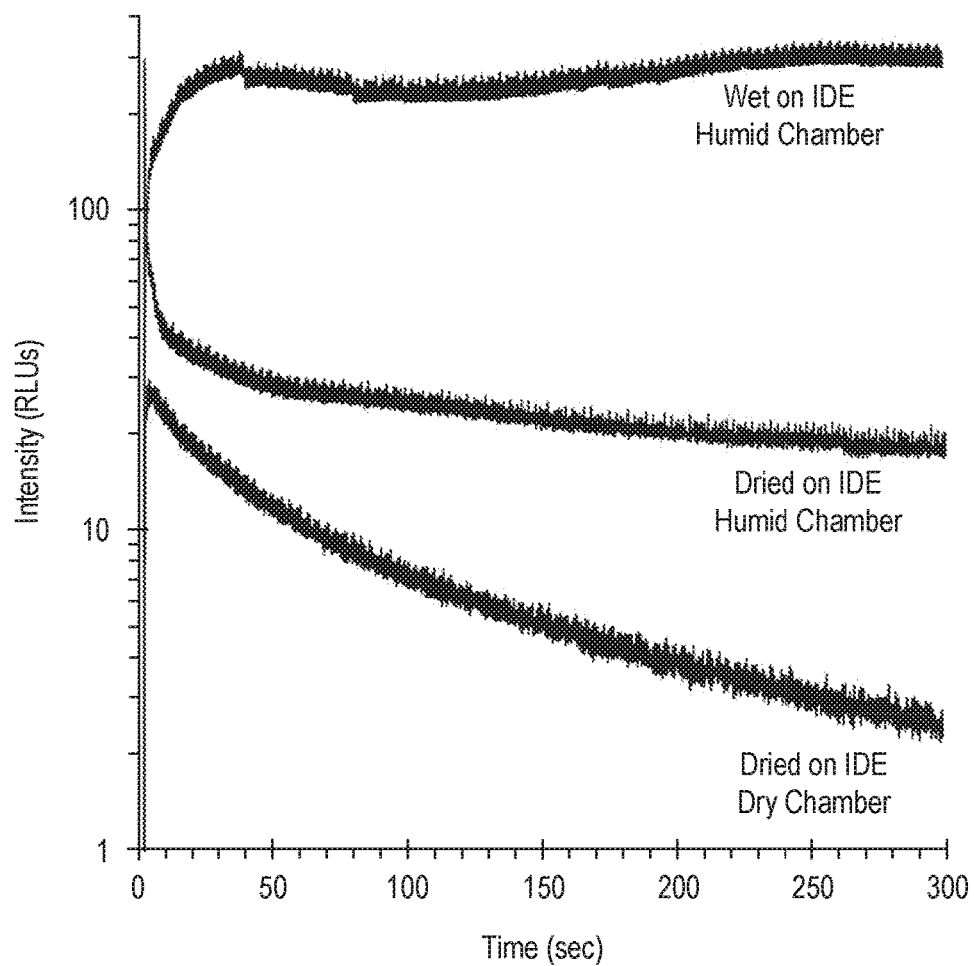
FIG. 11 is a graph illustrating enhanced electroluminescent emission of particles under varying humidity conditions.

A liquid media is disposed in the container 12. In the example embodiment, the liquid media is polar protic or polar aprotic. Polar liquid media may include but are not limited to water, dimethyl sulfoxide (DMSO), or dimethylformamide (DMF). In some embodiments, the liquid media may be in a gelatinous form. Confirming the role of water in enhancing electroluminescent emission, light output from particles under different conditions is shown in FIG. 11. Wet particles produce a much higher intensity emission than dry particles. In other embodiments, the liquid media is non-polar and may be selected from a group including but not limited to mineral oil, castor oil and linseed oil.

In a first example embodiment, solid state luminescent matter is suspended in the liquid media. In one embodiment, the luminescent matter is further defined as nanoparticles having dimensions less than 100 micrometers. In some embodiments, nanoparticles have dimensions less than 1 micrometer. In other embodiments, the luminescent matter may be core-shell particles, flakes or films having characteristic dimensions less than 100 micrometers.

The solid state luminescent materials may be chosen from elemental or composite semiconductor materials. For example, the elemental semiconductors may be silicon and/or germanium particles. In another example, compound semiconductors may be chosen from group IIB-VI element compositions, such as ZnO, ZnS, ZnSe, CdS, CdSe, CdTe. Composite structures such as particles having a CdSe core with ZnS shell are also contemplated by this disclosure. In yet another example, compound solid state luminescent materials may be chosen from group III-V elements like GaAs, as well as group IV-VI elements like PbS.

In some embodiments, the luminescent materials may be doped to produce light emission having different colors or wavelengths. In general, transition metal elements as well as rare earth elements are useful as dopants. For example, ZnS particles doped with manganese (Mn) emit orange light; whereas, ZnS particles doped with copper (Cu) produce green light. In other examples, luminescent materials can be doped with samarium (Sm), thulium (Tm), erbium (Er), neodymium (Nd), europium (Eu) or other lanthanide rare earth elements. From these examples, one skilled in the art will recognize other types of dopants may be suitable as well.

In certain applications, it is useful to have the luminescent material embedded in a matrix, or bound to other particles. To demonstrate the versatility of the disclosed method, solid state luminescent material were embedded in the matrices and then dispersed in the liquid media. Example matrices include but are not limited to silica gel, molecular sieve 13X, zeolites and cross-linked dextran gel (e.g., known as Sephadex). Depending on the application, it can be useful to coat or functionalize the luminescent particles with appropriate capping agents. In one embodiment, the disclosed electroluminescent system was demonstrated with luminescent particles that were coated with 3-mercaptopropionic acid (MPA), cetyltrimethylammonium bromide (CTAB), or cetyltrimethylammonium chloride (CTAC). Other capping, coating or functionalizing agents are also contemplated by this disclosure.

Solid state semiconductor light emitting diode (LED) chips are also useful as luminescent matter in the disclosed light emitting system 10. In one embodiment, AlInGaP LED chips were used to emit red light at 610 nm wavelength as depicted in FIG. 4C. In another embodiment, InGaN LED dice were used to emit blue and green emissions.

Solid state organic and organic metal coordination complexes capable of electroluminescence can also be useful in the disclosed light emitting system 10. A variety of small-molecule and polymeric organic light emitting materials, and organic-metal coordination complexes are available for use. An example embodiment of such material is anthracene crystals that were doped with trace amounts of tetracene and pentacene. Tris(8-hydroxyquinolinato) aluminium also known as Alq3, which is an organic coordination complex of aluminum was also used to produce a bright green-yellow emission with the disclosed light emitting system. From these various examples, one skilled in the art will readily recognize different types of luminescent materials that fall within the broader scope of this disclosure. It is also envisioned that more than one type of luminescent material or a mixture of luminescent materials may be suspended in the liquid media.

Light is produced by the light emitting system 10 when the luminescent matter that is dispersed in the media is energized by an electrical stimulation. Different electrode configurations are disclosed that enable the injection of electric charges from the power source into the liquid media. In the example embodiment, the pair of electrodes 14 is integrated into the floor of the container 12 as seen in FIG. 1. While one pair of electrodes is shown, it is envisioned that two or more pairs of electrodes may be used to inject electric charge into the liquid media.

Figure 3A:
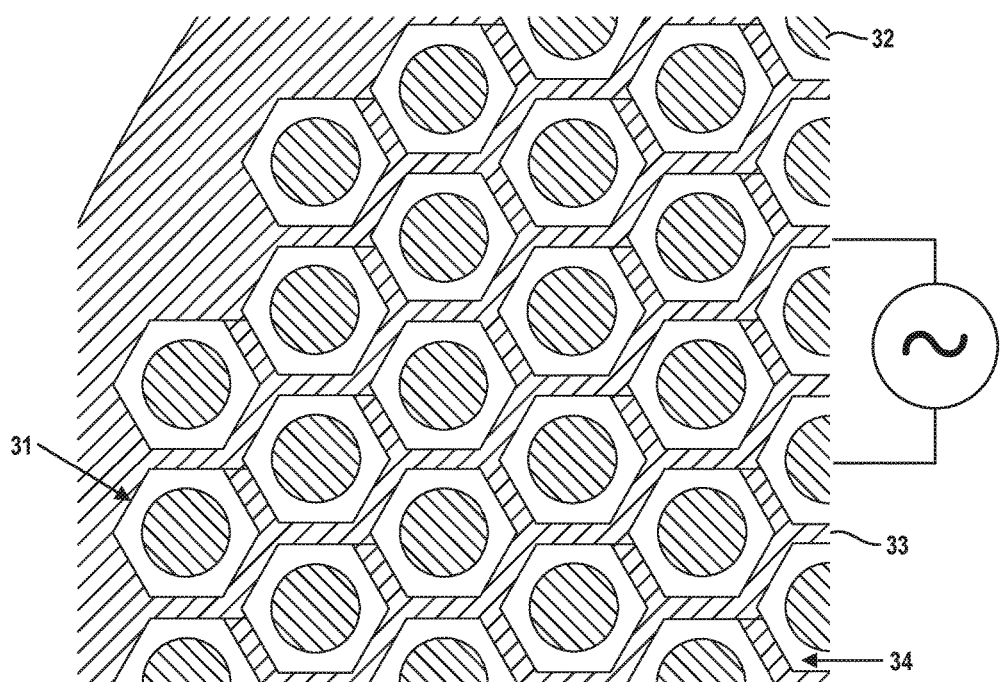
FIG. 3A is a diagram of an electrode configuration having a tessellated arrangement.
Figure 3B:
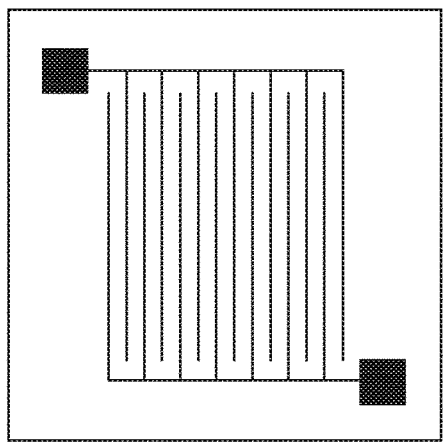
FIG. 3B-3D are diagrams depicting different arrangements for interdigitated electrodes.
Figure 3C:
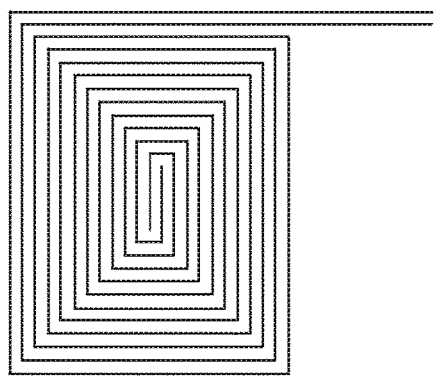
Figure 3D:
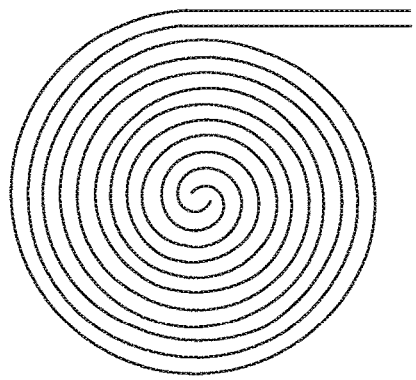

In one embodiment, the electrodes are in a tessellated arrangement on a planar inner (bottom) surface of the container 14 as seen in FIG. 3A. That is, a plurality of driving cells 31 are arranged abutting each other with no overlap or gaps between cells. Each driving cell 31 includes a core electrode 32 surrounded by a peripheral electrode 33 with an insulator 34 optionally interposed therebetween. The electrodes are preferably coplanar with each other but may be offset from each other in other arrangements. In other embodiments, the electrodes are interdigitated. Examples of interdigitated electrodes that can be used in the light emitting system 10 are shown in FIGS. 3B-3D. The electrodes may be made of gold, silver, aluminum as well as other metals, metal alloys (e.g., indium tin oxide (ITO) or fluorine doped tin oxide), semiconductor materials, or other types of conductive materials, such as glassy carbon, graphite and graphene.

Figure 2A:
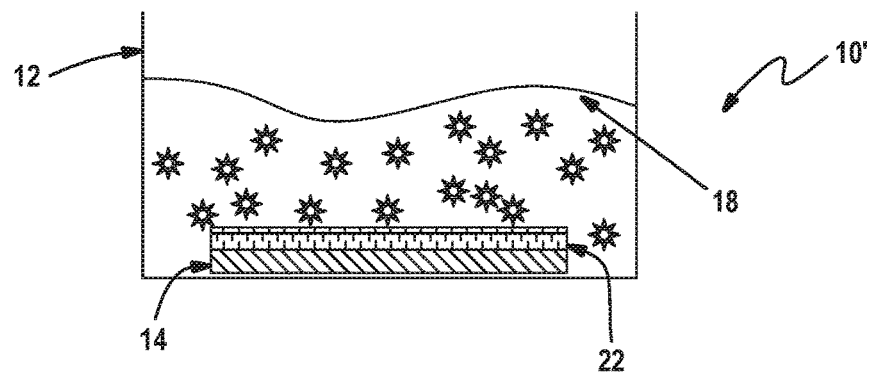
FIG. 2A depicts a second example embodiment of the light emitting system.

FIG. 2A depicts a second example embodiment of a light emitting system 10' for generating light from luminescent matter. The light emitting system 10' includes a support member 12 (i.e., container), at least one pair of electrodes 14 and an excitation source (not shown). In this example embodiment, the electrodes 14 are coated or otherwise separated from the liquid media 18 by a dielectric material 22. Example dielectric materials include but are not limited to silicon nitride, silicon oxide, aluminum oxide, pyrex, poly styrene (PS), polymethyl methacrylate (PMMA), polytetrafluoroethylene (PTFE), polydimethylsiloxane (PDMS). Other types of dielectric and insulating materials are also contemplated by this disclosure. Except with respect to the differences discussed above, the light emitting system 10' may be substantially the same as the light emitting system 10 and its variants described above.

Figure 2B:
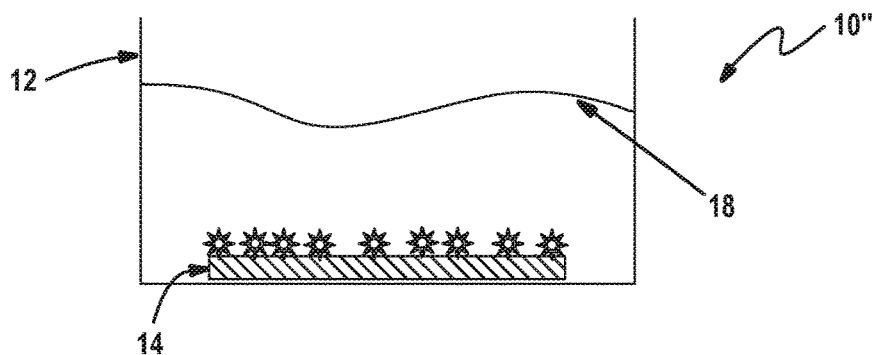
FIG. 2B depicts a third example embodiment of the light emitting system.
Figure 2C:
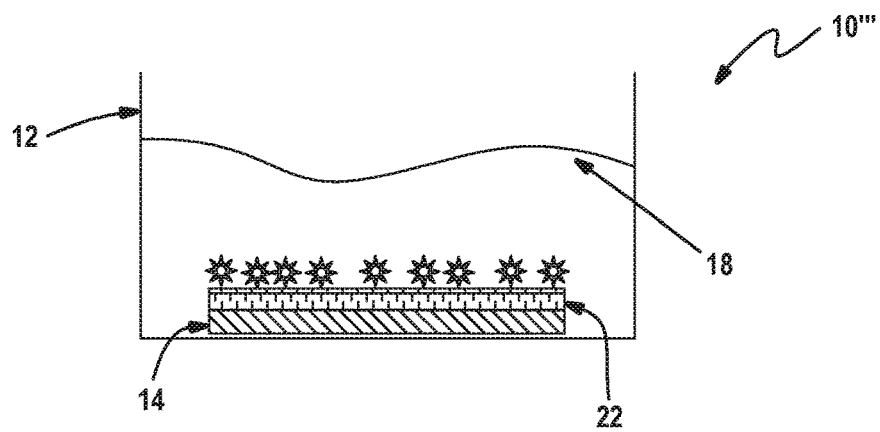
FIG. 2C depicts a fourth example embodiment of the light emitting system.

FIG. 2B depicts a third example embodiment of a light emitting system 10" for generating light from luminescent matter. The light emitting system 10" again includes a support member 12 (i.e., container), at least one pair of electrodes 14 and an excitation source (not shown). In this example embodiment, the nanoparticles are no longer suspended in the liquid media 18. Rather, the nanoparticles are deposited onto a surface of the electrodes 14. In one example, the nanoparticles are deposited onto the surface of the electrodes. To do so, the nanoparticles may be in a liquid and then the liquid is removed (e.g., by evaporating the liquid), thereby depositing the nanoparticles onto the surface of the electrodes. In some cases, the nanoparticles are also deposited onto the support member and positioned in between the electrodes. The same or different liquid media may be re-introduced into the support member 12 such that the liquid media overlays the nanoparticles disposed on the electrodes. This approach also applies to electrodes 14 coated with a dielectric material 22 as seen in the light emitting system 10''' in FIG. 2C. Other techniques for coating, bonding or otherwise fixating the nanoparticles to the surface of the electrode are also contemplated by this disclosure. Except with respect to the differences discussed above, light emitting systems 10" and 10''' may be substantially the same as the light emitting system 10 and its variants described above.

Figure 4A:
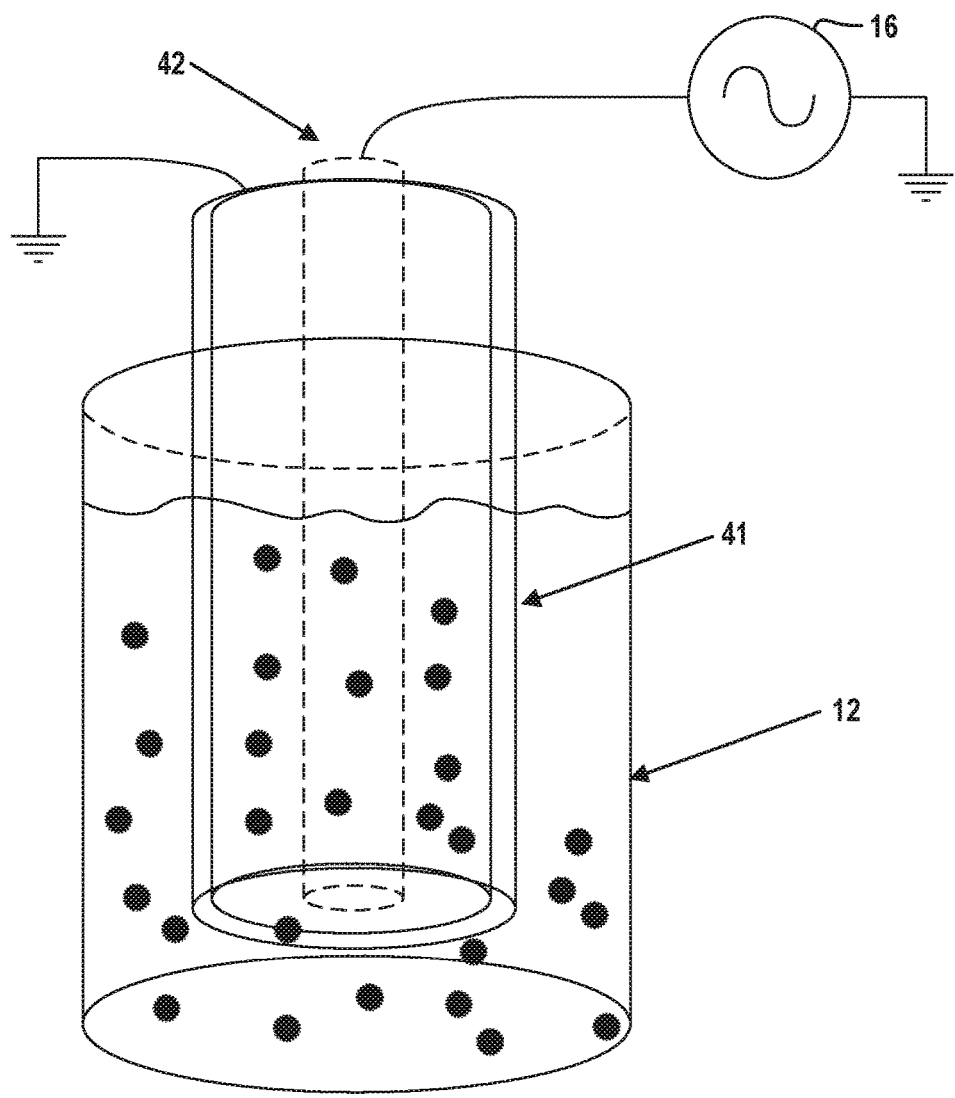
FIG. 4A-4C are diagrams depicting different forms for a supporting member which may be used in the light emitting system.
Figure 4B:
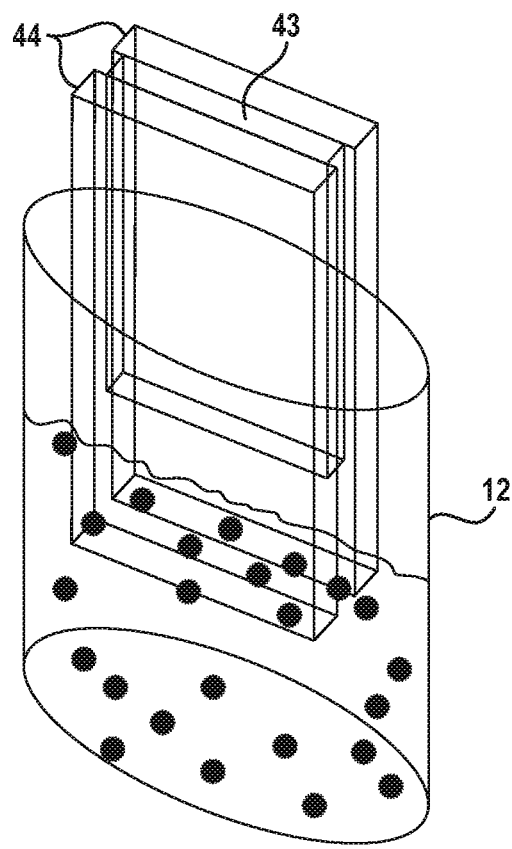
Figure 4C:
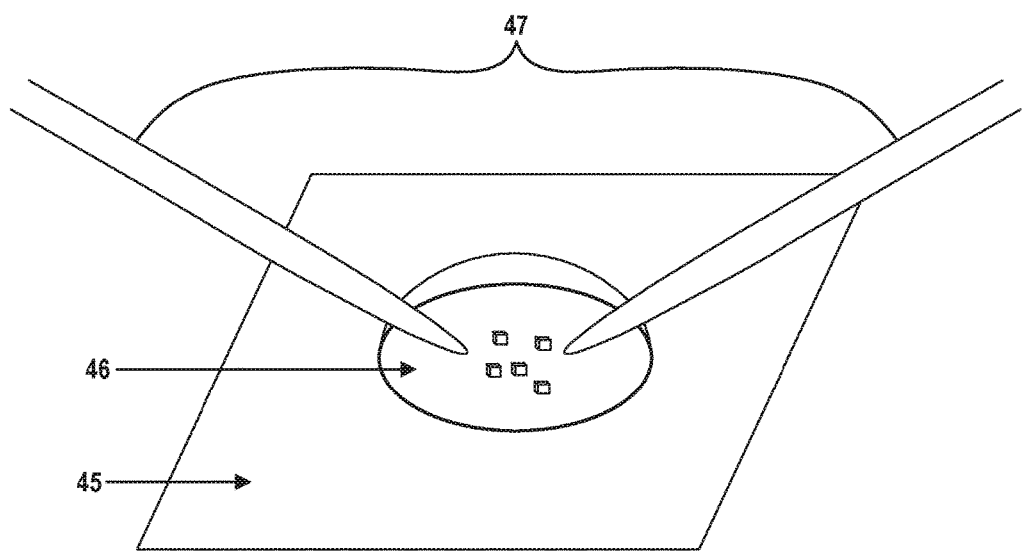

With reference to FIGS. 4A and 4B, the container in the light emitting system 10 may take different forms as well. In FIG. 4A, the container 12 is transparent and has a cylindrical shape. The pair of electrodes 14 is further defined as a transparent tubular electrode 41 having a conductive inner surface and a cylindrical metal electrode 42 positioned inside the tubular electrode 41. The cylindrical metal electrode 42 is preferably arranged concentric with the tubular electrode 41. One electrode serves as an anode while the other electrode serves as a cathode. The container 12 holds a liquid media with nanoparticles suspended therein. Except with respect to the differences discussed above, the light emitting system 10 with a circular cylinder shaped container operates in the manner set forth herein.

In FIG. 4B, the container 12 has an elliptical cylinder shape. In this example, the electrodes 14 are comprised of two plates 44 arranged in parallel with each other, with an insulating spacer 43 placed between. During operation, one of the two plates may serve as the cathode with current flowing across the gap formed by the insulating spacer 43 to the opposing anode. In this example, nanoparticles may be drawn into the gap between the electrodes by capillary action and illuminated by the current flowing between the plates. Except with respect to the differences discussed above, the light emitting system 10 with an elliptical cylinder shaped container operates in the manner set forth herein.

In some embodiments, the container may be replaced by any type of support member. For example, a plate 45 may be used as the support member as seen in FIG. 4C. In this example, the plate 45 has a non-conducting surface and a liquid droplet 46 is placed onto the non-conducting surface. Liquid droplets may be retained on the support member by surface tension and luminescent particles are suspended in the liquid droplet. To excite the particles, a pair of needle type electrodes 47 is inserted into the liquid droplet 46. In other embodiments, the electrodes may be integrated into the surface of the support plate. The plate is merely exemplary and other types of members which can support the liquid media also fall within the broader aspects of this disclosure. Except with respect to the differences discussed above, the light emitting system 10 with a plate support member operates in the manner set forth herein.

Light is produced from the recombination of electric charges of opposing polarity in or on the luminescent materials. The luminescent materials dispersed in the liquid media produce light when the liquid wets the electrodes and the electrodes are energized by a power source. An excitation signal is generated between the electrodes and may take different forms. In one embodiment, the excitation electrical stimulus is in the form of a constant voltage (direct current or DC) applied between the electrodes. Single or multiple flashes of light are produced from the excited luminescent particles. To produce continuous light emission, the polarity of the applied voltage periodically changes from positive to negative and vice versa. The varying voltage may have different waveforms including but not limited to sine, square, triangle, and sawtooth waveforms. In some embodiments, combinations of these waveforms may be used.

Figure 5A:
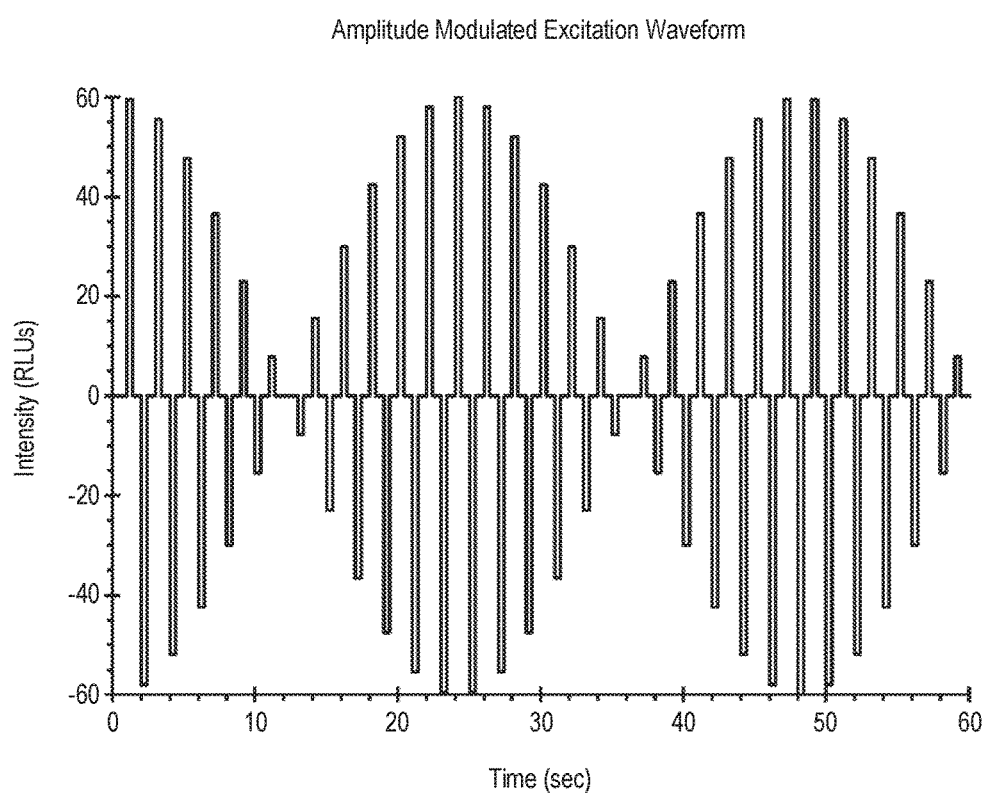
FIGS. 5A and 5B are diagrams of excitation waveforms that are amplitude and frequency modulated, respectively.
Figure 5B:
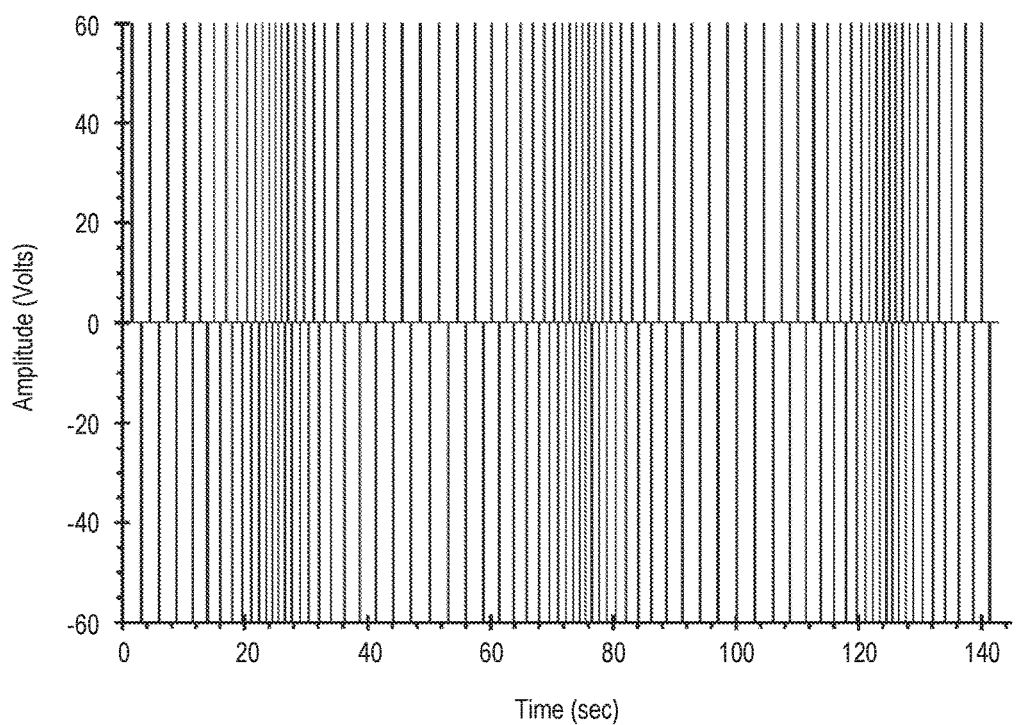
Figure 5C:
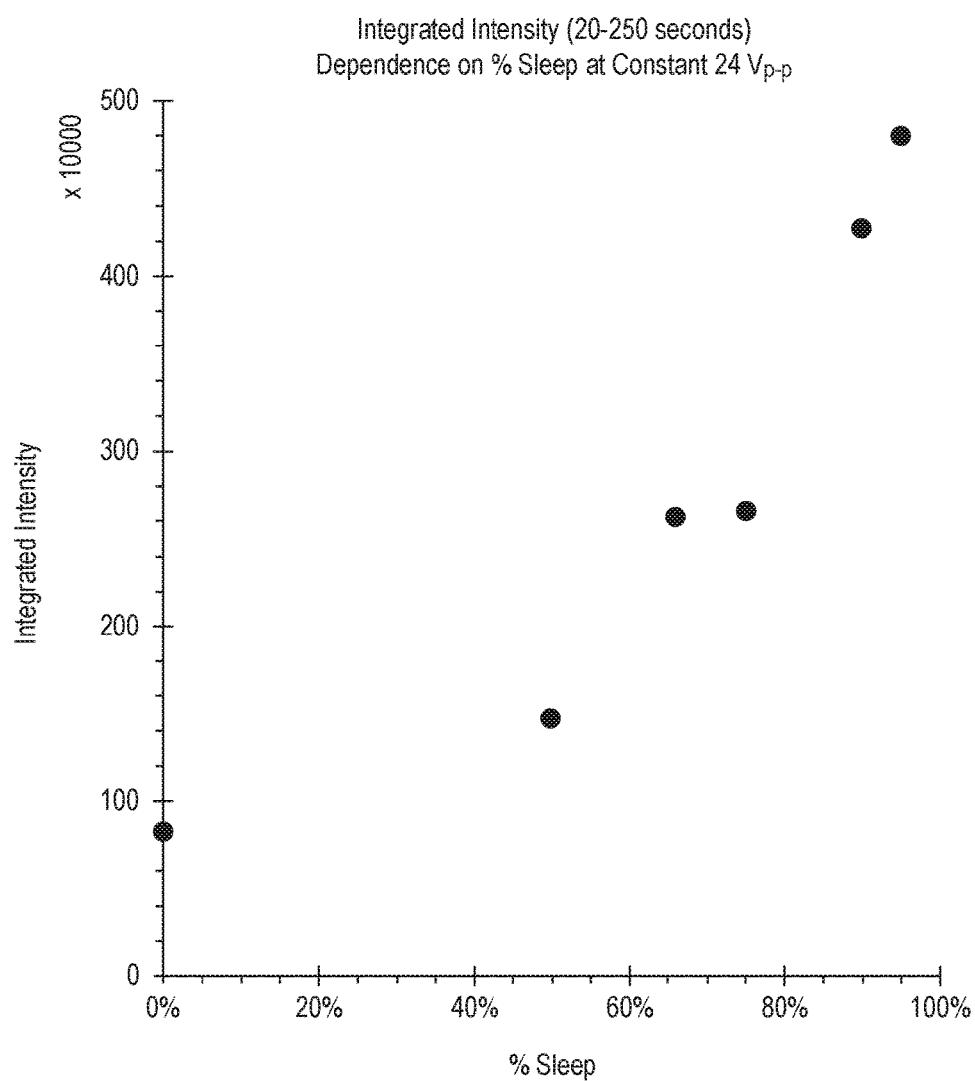
FIG. 5C is a graph showing the dependence of light intensity on the percent sleep time of the excitation signal.

In other embodiments, the pulses of voltage may be separated by a period of inactive sleep time. Voltage pulses have magnitudes that oscillate between a peak positive value and a peak negative value. During the sleep period, the magnitude of the voltage is set at a baseline value that is less than the peak value of the pulses. For example, the baseline value may be zero or another nominal value, such as ±one volt. This feature is useful for minimizing gas evolution due to electrolysis and extending the life of the electrodes. The percentage sleep time can also be used to modify the intensity of light emission, as seen in FIG. 5C. In yet other embodiments, the excitation waveform may be modulated according to a second waveform. For example, the excitation waveform may be modulated such that the peak value of the voltage pulses applied between the electrodes varies over time as shown in FIG. 5A. In another example, the excitation waveform may be modulated such that frequency of the pulses varies over time as shown in FIG. 5B. This enables excitation of luminescent particles across a broad range of amplitude and frequency of the periodic electrical stimulus.

Different examples are set forth below to demonstrate the disclosed technique for exciting electroluminescent material in a liquid media and thereby emit light. These examples are not intended to be limiting. It is readily understood that different types of luminescent materials, liquid media, electrode arrangements and excitation methods fall within the scope of this disclosure.

Figure 6:
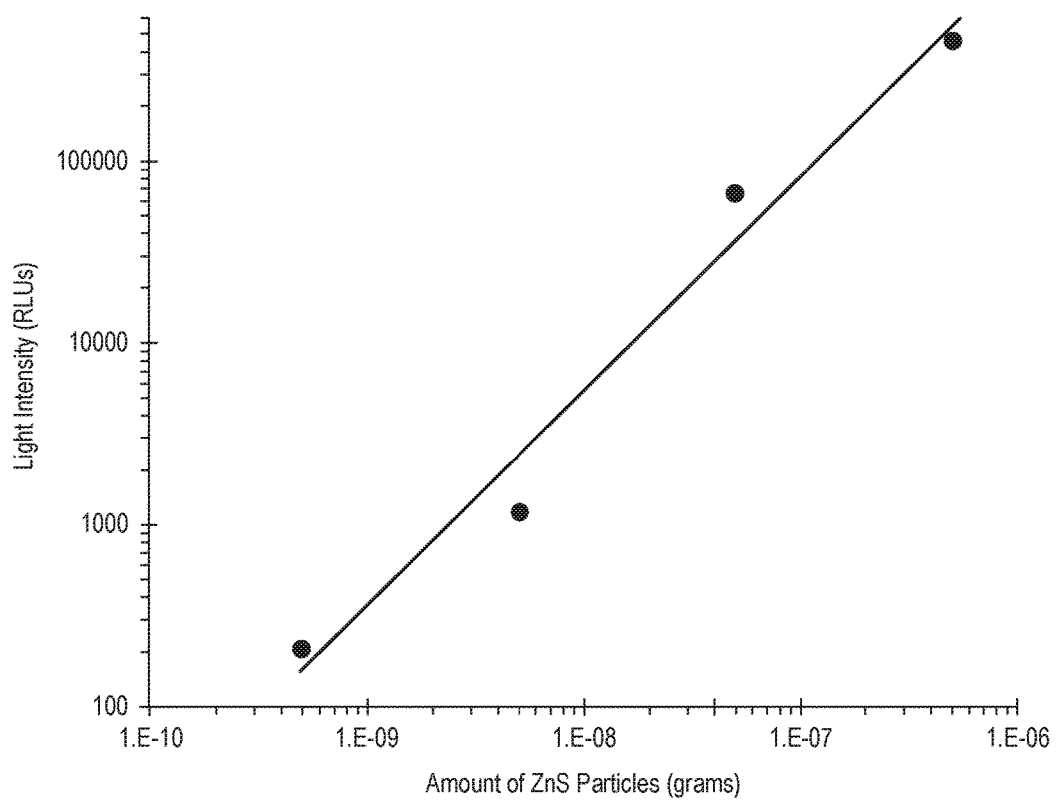
FIG. 6 is a graph showing the dependence of light intensity on the amount of luminescent particles dispersed in the liquid media.

In a first example, zinc sulfide (ZnS) nanoparticles are dispersed in a polar liquid medium. A wet chemistry method is used to synthesize ZnS nanoparticles on the pores of a silica gel matrix. The pores of the silica gel facilitate nucleation of the crystals and limit their growth to form nanoparticles. The nanoparticles are released from the porous silica gel matrix into water to form a homogenous suspension. Transmission Electron Microscopy (TEM) was used to verify the presence of nanoparticles in the transparent suspension. A droplet of the water/ZnS nano-suspension is placed on the surface of an interdigitated electrode (IDE) array with 25 micrometers (μm) inter-electrode spacing. Electrical energy is applied to the IDE array in the form of a square wave voltage signal with a frequency of 57 Hz and peak-to-peak amplitude of 24 volts. A sensitive CCD camera is used to record the blue emission emerging from the nanoparticles on the surface of the IDE electrodes. FIG. 6 shows the dependence of light intensity on the amount of luminescent ZnS particles dispersed in water. Electroluminescence of the following metal chalcogenide nanoparticles was confirmed using similar synthesis, sample preparation and testing procedures: ZnO, ZnSe, and CdS—ZnS core-shell nanoparticles.

Figure 7:
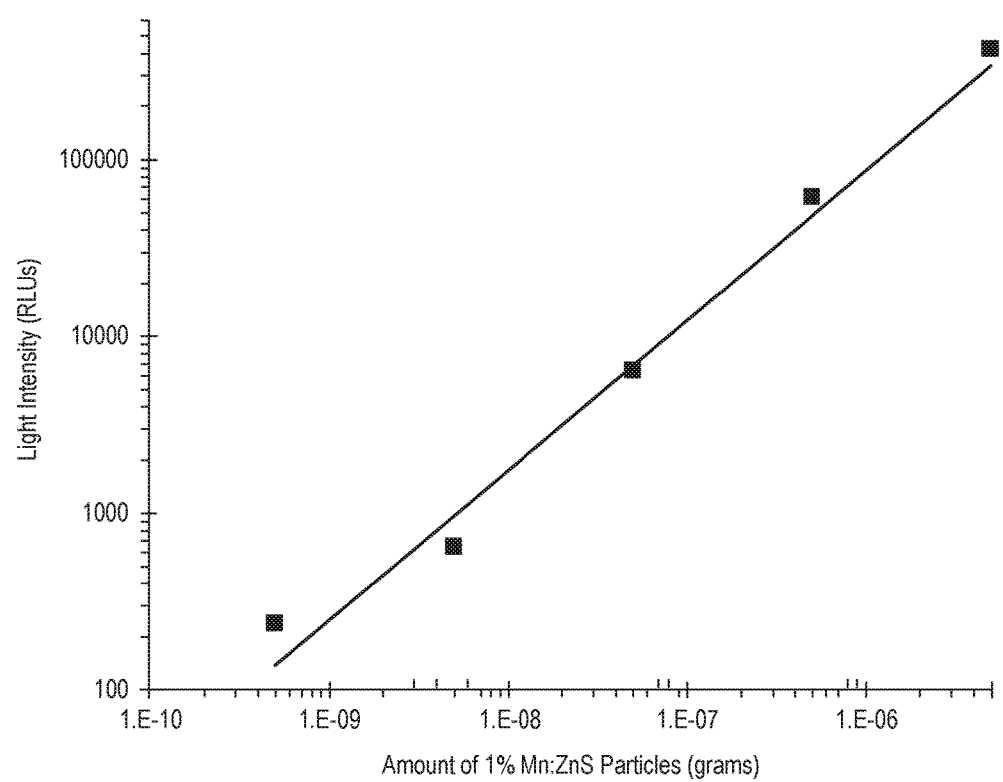
FIG. 7 is another graph showing the dependence of light intensity on the amount of luminescent particles dispersed in the liquid media.
Figure 8:
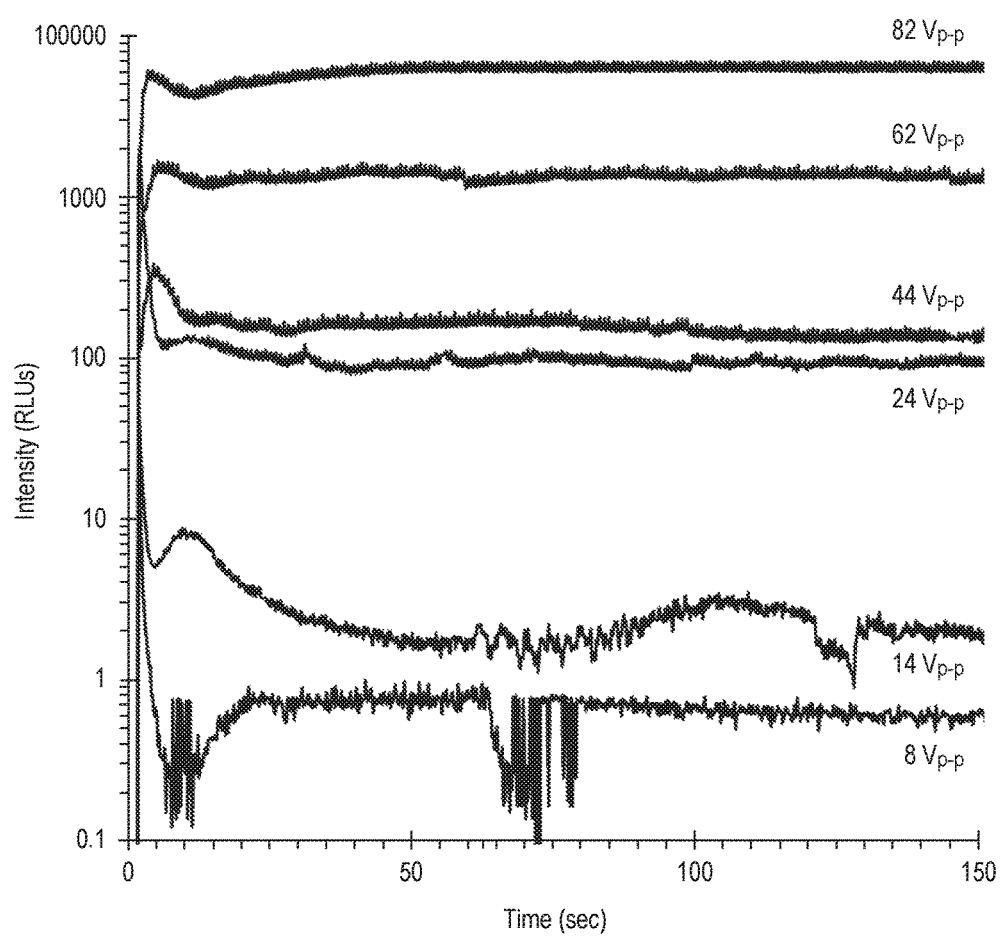
FIG. 8 is a graph showing the dependence of intensity of light emission on magnitude of excitation signal.

In a second example, electroluminescence was achieved from ZnS nanoparticles doped with Mn, and dispersed in polar liquid media. A wet chemistry co-precipitation method was used to synthesize ZnS nanoparticles doped with manganese (e.g., Mn, 1% mole ratio of Mn/Zn) in the presence of molecular sieve 13X porous solid phase matrix. Nanoparticles were released in water from the solid phase matrix in order to form a homogenous transparent suspension of nanoparticles. TEM and X-Ray Diffraction (XRD) analysis were used to confirm the presence of nanoparticles in the resulting suspension. A droplet of the ZnS:Mn nanoparticle suspension in water was placed on the surface of an IDE with 40 μm electrode spacing. Time-varying voltage having a square wave profile with a frequency of 57 Hz and peak-to-peak amplitude of 30 V was applied to the electrode array. A CCD camera was used for imaging the electroluminescence. ZnS:Mn nanoparticles that were dispersed in water produced yellow-orange electroluminescence. Alternative excitation waveforms with different wave profiles, frequency and amplitude were used to stimulate the luminescent materials, and a luminometer was used to detect and record the light output. FIG. 7 shows the dependence of light intensity on the amount of luminescent ZnS:Mn particles dispersed in water. Specifically, time varying voltage sources having the following waveforms were demonstrated: sine, square, sawtooth, and sequences of positive and negative polarity pulse waveforms. FIG. 8 depicts the intensity of light emission over time, measured with a luminometer, from a sample Mn doped ZnS nanoparticles in water excited with a waveform consisting of a sequence of positive and negative voltage pulse repeating a 57 Hz and 95% sleep time for various peak-to-peak voltages. Similar synthesis and sample preparation procedures were used to produce ZnS nanoparticles that were doped with copper (Cu). Cu doped ZnS nanoparticles dispersed in water produced green EL. Incorporating small amounts of dopant elements in the nanocrystals enables adjusting of the color or wavelength of the electroluminescence emission from the nanoparticles. In addition to Cu and Mn from the transition metal elements, aluminum (Al), and the following dopants belonging to the rare earth elements were demonstrated for synthesis and testing of EL from ZnS nanoparticles: Sm, Tm, Er, Nd and Eu.

In a third example, ZnS nanoparticle doped with Mn are synthesized via a hydrothermal method. The nanoparticles are dispersed in mineral oil. A droplet of the suspension was placed on the surface of an IDE with 25 μm electrode spacing. Electrical energy applied to the IDE array is the form of a square wave with the peak-to-peak amplitude of 1500 V and a frequency of 1000 Hz. The electroluminescence emission of the nanoparticles was imaged by a CCD camera.

Figure 10:
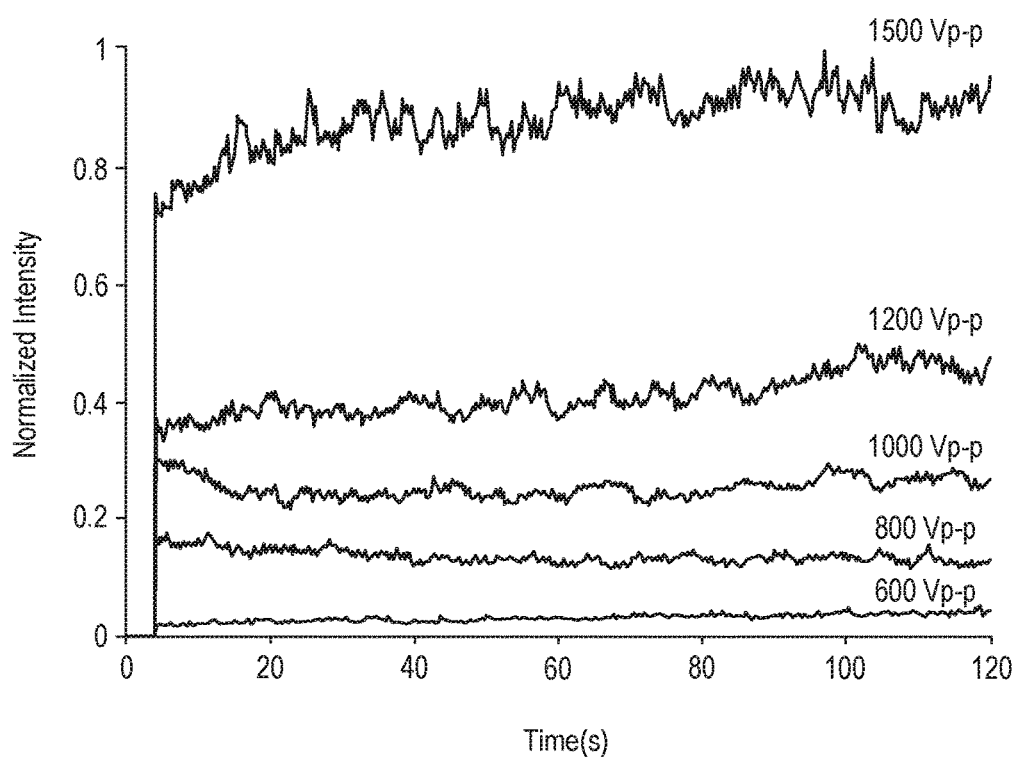
FIG. 10 is a graph showing light intensity from nanoparticles in a particular implementation of the light source.

In a fourth example, ZnS nanoparticles doped with Mn are again synthesized through a hydrothermal method. The nanoparticles are suspended in water and a droplet of this suspension was placed on the surface of an IDE with 25 μm electrode spacing. The electrode with the suspension on it was put in a desiccator until the water was evaporated and the nanoparticles were dried on the surface of the electrode. A droplet of mineral oil is then placed on the surface of the electrode, thereby covering the dried nanoparticles on the surface of the electrode. The nanoparticles were excited by applying an electrical stimulus in the form of a square wave with the peak-to-peak amplitude of 1500V and frequency of 1000 Hz. A CCD camera was used to capture the electroluminescent emission of nanoparticles. FIG. 10 illustrates the dependence of the intensity of the electroluminescent emission from ZnS:Mn nanoparticles suspended in mineral oil at different applied voltage magnitudes.

In a fifth example, polymethyl methacrylate (PMMA) was disposed and dried on the surface of an IDE with 25 μm electrode spacing to form a thin dielectric layer on the electrode. A droplet of nanoparticles suspended in water was placed on the dielectric-coated electrode. The electrode was placed in a desiccator until the nanoparticles dried. A droplet of mineral oil was then placed on the surface of the electrode, covering the dried nanoparticles on the surface of the electrode. An electrical energy with the peak-to-peak amplitude of 2000V and frequency of 1000 Hz was applied to the electrodes, and the bright yellowish orange electroluminescent emission of the ZnS:Mn nanoparticles was imaged using a CCD camera.

In a sixth example, ZnS doped with Mn nanoparticles were embedded in a cross-linked matrix of dextran, commercially known Sephadex. Sephadex is used in separation columns for fractionating molecules, DNA purification and the removal of small molecules during the preparation of large biomolecules, such as radioactive or fluorescent labels. Electroluminescence was observed from the luminescent nanoparticles that were embedded in Sephadex in an aqueous media. The particles are embedded within the matrix by swelling the Sephadex in water for 1 hour, followed by in-situ synthesis of the ZnS:Mn nanoparticles. Presence of nanoparticles within the matrix is evident from the orange photoluminescence (PL), which is the characteristic photoluminescence of Mn doped ZnS crystals. A wet sample of the nanoparticle/Sephadex composite is deposited onto the IDE electrode array and energized with a 60 Hz electric source, which generates a sinusoidal voltage wave with a peak to peak amplitude of 40V. The yellow-orange electroluminescent emission from the sample is recorded using a CCD color camera. Similarly, composite particles featuring a paramagnetic core, and a shell made of Mn doped ZnS are synthesized and dispersed in water. A droplet of the homogenous suspension is placed on an IDE array with an inter-electrode spacing of 10 µm. The setup is energized using a square wave voltage source at 57 Hz and peak-to-peak amplitude of 36V to generate yellow-orange electroluminescence. When a magnet is placed under the electrode surface, the EL intensity increases dramatically as more of the magnetizable-luminescent composite particles are pulled from the body of the liquid to the electrode surface.

In a seventh example, light emission is achieved by placing solid state light emitting diode chips in polar liquid media. Particles consisting of AlInGaP semiconductor diode chips were dispersed in water. The particle laden suspension was deposited in a 2 mm gap formed between a pair of needle type electrodes (e.g., see FIG. 4C). A power supply providing a sinusoidal voltage wave at 30 kHz was applied to electrodes. The semiconductor dice emitted red electroluminescence at 610 nm in water, without the need to have the electrodes hard-wired to the dice.

In an eighth example, electroluminescence was achieved from organic, and metal-organic compounds in a liquid media. For instance, powders of anthracene doped with 0.3% w/w tetracene, and anthracene doped with 0.3% w/w pentacene were synthesized by dissolving the host crystal and dopant crystals in a heated solvent such as benzene or toluene, followed by a slow cool down of the solution. The doped organic crystals were extracted from the solvent using a rotary evaporator under partial vacuum at 55° C. The dry crystalline flakes were added to water and blended to form a homogenous slurry. A droplet of the resulting suspension was placed on the surface of an IDE array, featuring an inter-electrode spacing of 10 µm. The electrodes were energized with a voltage source that produces positive and negative polarity pulses with an amplitude of 45V. The pulses in each cycle are spaced apart by a sleep period (0V amplitude) equal to 90% of the cycle duration. Excitation cycles were repeated at a rate of 57 Hz. Green electroluminescence was emitted by the doped anthracene particles which were dispersed in water. In the second embodiment, electroluminescence of tris 8-hydroxyquinolinato aluminum (Alq3) a metal-organic coordination complex of aluminum was demonstrated in water. Two planar (plate) electrodes were separated from each other with a thin spacer, as shown in FIG. 4B. One of the electrode plates consists of a glass substrate onto which a thin metallic film is deposited. The deposited metal film features openings in order to allow light generated in the inter-electrode gap to escape the cavity through the transparent glass. The second electrode is a simple metallic plate. The first electrode is coated with a thin layer of Alq3 and attached to the negative terminal, and the opposing electrode was coated with N,N'-Bis(3-methylphenyl)-N,N'-diphenylbenzidin (TPD) and connected to the positive terminal of a DC power source. The gap between the electrodes is filled with water and the electrodes are energized to produce green electroluminescence.

In a ninth example, electroluminescence was achieved from luminescent microparticles with a protective oxide coating. Specifically, Mn doped ZnS phosphor particles coated with an aluminum oxide shell were suspended in water to form a homogenous slurry. The average diameter of the particles is 25 µm. A droplet of the slurry was placed in the gap between two plate electrodes. The electrodes are energized with a square wave voltage source with frequency of 57 Hz and peak-to-peak amplitude of 48 V. Orange-yellow emission is detected using a CCD camera.

Figure 9:
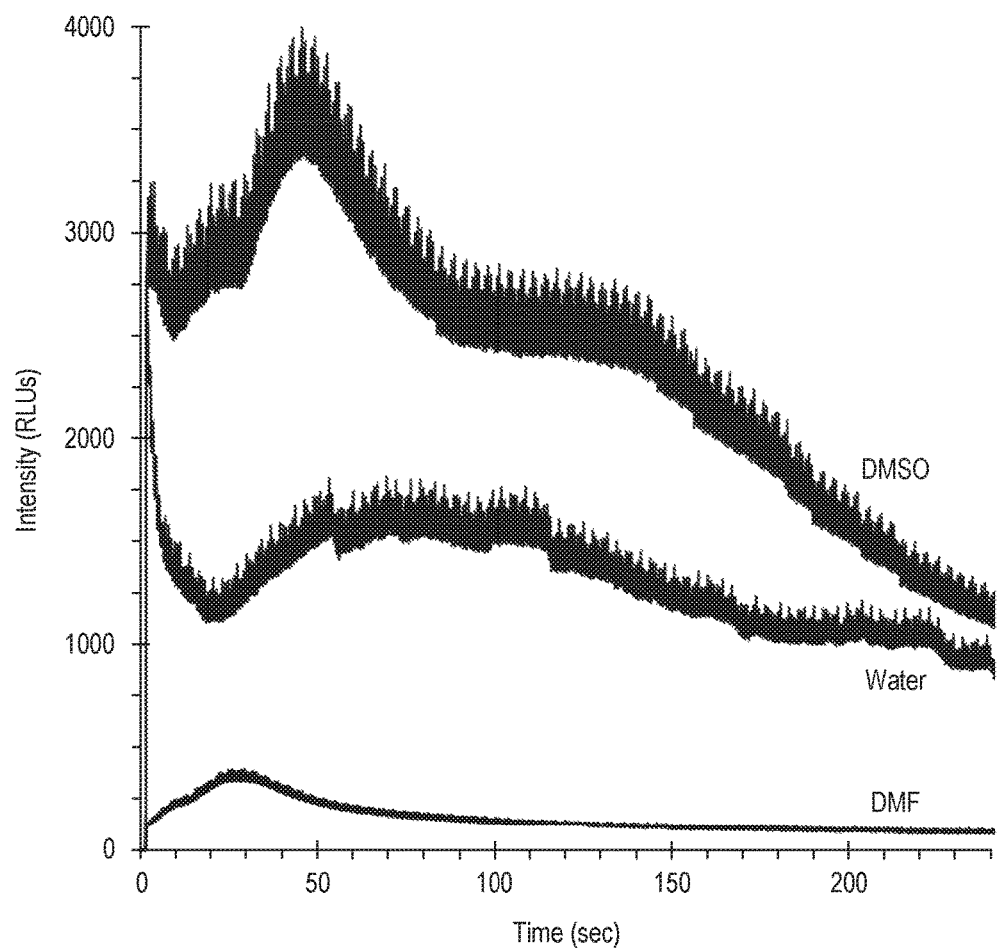
FIG. 9 is a graph showing light intensity as a function of the type of liquid media.

In a tenth example, electroluminescence was achieved with nanoparticles of ZnS doped with Mn dispersed in various polar liquid media. For instance, nanoparticles of ZnS doped with Mn synthesized in the pores of molecular sieve 13X were released in the following fluids to form a homogenous slurry: water, dimethyl sulfoxide (DMSO), and dimethylformamide (DMF). The homogenous slurry was placed on an interdigitated array of electrodes and energized with a 62 V peak-to-peak, 57 Hz, pulse waveform with 95% sleep time. FIG. 9 is a graph depicting light intensity as a function of time for each of the three samples illustrating the ability to produce electroluminescence from the nanoparticles in both polar protic and polar aprotic solvents. Another variation of the experiment was carried out where the nanoparticle slurry was dried on the interdigitated electrode and then enclosed in a humid chamber exposed to the DMF and DMSO vapors of the liquid. The particles exhibited electroluminescence in the presence of the vapors, but did not electroluminescence in their absence.

20 µL of 5 mg/mL aqueous solution of Mn-doped ZnS nanoparticles was applied onto aluminum interdigitated electrodes. The setup was placed in a freezer until the solution reached solid phase. The setup was energized at peak-to-peak voltage of 350 VAC at 100 Hz. The waveform used for this experiment was a square wave with 90% sleep. The following observations were made:

a. The nanoparticles remained intact in the suspension in the solid phase. This feature is of interest as a storage method to inhibit the coagulation of phosphors into larger crystals over time.
b. The solid mixture did not respond to the energization, ie, no emission was captured when particles were energized in the solid phase.
c. The energization allowed the melting of the solid mixture during which the continuous energization of the solution resulted in increasing emission. The increasing emission as a function of the duration of energization is important for kinetic studies. More importantly, the uniform emission observed upon complete phase transition indicated that the homogenous suspension remained intact during the storage period.

In another embodiment, copper-plated aluminum electrode was used to energize an aqueous solution of Mn-doped ZnS nanoparticles. One copper electrode and a copper-plated aluminum sheet were used. The aqueous solution of the nanoparticles was applied onto the copper-plated sheet and energized at a peak-to-peak voltage of 350 VAC at 100 Hz with a 90% sleep square waveform. The light output was detected and recorded by a digital camera. The emission on the copper-plated aluminum sheet was found to be localized only to areas where there was a defect in the copper plating.

In another embodiment, the role of the composition of electrodes were investigated. Here, two electrodes were used to energize an aqueous solution of Mn-doped ZnS nanoparticles. The applied peak-to-peak voltage was 350 VAC at 100 Hz. The waveform used for this experiment was a square wave with 90% sleep. One electrode was aluminum, while the counter-electrode was selected from magnesium, zinc, aluminum, stainless steel, nickel and copper. The emission output of the different electrode pairs under electric field was recorded using both a digital camera and a luminometer in each trial.

In yet another embodiment, two non-aluminum electrodes were examined for their ability to energize and excite an aqueous solution of Mn-doped ZnS nanoparticles. Here, 20 µL of 5 mg/ml aqueous solution of nanoparticles was applied onto an ITO-coated glass electrode as the support member.

A copper wire was used as a counter-electrode to energize the solution at a peak-to-peak voltage of 350 VAC at 100 Hz. The waveform used for this experiment was a square wave with 90% sleep. Upon energization, no emission was detected (labeled as 'control experiment'). Thereafter, a 3 mm-diameter aluminum particle was laid over the aqueous solution of Mn-doped ZnS nanoparticles and re-energized. The emission was captured by a digital camera. The observed emission was located between the copper wire and the aluminum particle.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for producing light, comprising:
providing a light source, comprising
a support member;
a liquid media supported by the support member;
at least one pair of electrodes disposed on the support member, wherein electrodes disposed on the at least one pair of electrodes are arranged coplanar with each other, where nanoparticles are deposited on the support member and are in between the electrodes in the at least one pair of electrodes, the nanoparticles are comprised of a luminescent material and are in the presence of the liquid media; and
an excitation source electrically coupled to the at least one pair of electrodes and operable to apply an excitation signal between the electrodes in the pair of electrodes; and
generating an excitation signal between the electrodes in the pair of electrodes, thereby causing light emission from the nanoparticles.

2. The method of claim 1 wherein generating an excitation signal further comprises generating an electric current between the electrodes of the pair of electrodes.

3. The method of claim 1 wherein generating an excitation signal further comprises applying a voltage between the electrodes of the pair of electrodes, where polarity of the voltage periodically changes from positive to negative and vice versa.

4. The method of claim 1 wherein generating an excitation signal further comprises applying a voltage between the electrodes of the pair of electrodes in the form of pulses, wherein the pulses are separated by a period of time in which the magnitude of the voltage is a baseline value that is less than a peak value of the pulses.

5. The method of claim 4 further comprising adjusting the peak value of the pulses over time.

6. The method of claim 3 wherein the voltage varies sinusoidally.

7. The method of claim 1 wherein both electrodes are comprised of aluminum.

8. The method of claim 1 wherein one of the pair of electrodes is comprised of aluminum and the other is comprised of a substance selected from the group consisting of magnesium, zinc, stainless steel, nickel and copper.

9. The method of claim 1 wherein each of the pair of electrodes is comprised of a metal selected from the group consisting of gold, silver, magnesium, zinc, iron, nickel and copper, and wherein aluminum metal is added to the nanoparticles in the liquid media deposited on the support member.

10. The method of claim 9 wherein the aluminum metal is in the form of nanoparticles or microparticles.

11. The method of claim 1 further comprising:
dispersing the nanoparticles in the liquid media;

depositing the dispersion of nanoparticles on the support member;
freezing the dispersion of nanoparticles;
generating an excitation signal between the electrodes in the pair of electrodes, whereby no light is emitted from the nanoparticles; and
allowing the frozen dispersion of nanoparticles to reach the liquid phase whereby light is then emitted from the nanoparticles.

* * * * *

UNITED STATES PATENT AND TRADEMARK OFFICE
CERTIFICATE OF CORRECTION

PATENT NO. : 10,159,136 B2
APPLICATION NO. : 16/005085
DATED : December 18, 2018
INVENTOR(S) : Hashem Akhavan-Tafti It is certified that error appears in the above-identified patent and that said Letters Patent is hereby corrected as shown below:

In the Specification

Column 2, Line 66, delete "FIG." and insert --FIGS.-- therefor.

Column 3, Line 1, delete "FIG." and insert --FIGS.-- therefor.

Column 4, Line 47, delete "Alq3" and insert --$Alq_3$-- therefor.

Column 5, Line 1, delete "14" and insert --12-- therefor.

Column 9, Line 30, delete "55° C" and insert --55 °C-- therefor.

Column 9, Line 43, delete "Alq3" and insert --$Alq_3$-- therefor.

Column 9, Line 52, delete "Alq3" and insert --$Alq_3$-- therefor.

In the Claims

Column 12, Claim 1, Line 2, after "comprising" insert --:-- therefor.

Signed and Sealed this
Thirtieth Day of April, 2019

Andrei Iancu
*Director of the United States Patent and Trademark Office*